US 11,092,557 B2

(12) United States Patent
Han

(10) Patent No.: US 11,092,557 B2
(45) Date of Patent: Aug. 17, 2021

(54) METHOD FOR GENERATING A RESULT IMAGE

(71) Applicant: Carl Zeiss Microscopy GmbH, Jena (DE)

(72) Inventor: Luyang Han, Heidenheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/828,316

(22) Filed: Mar. 24, 2020

(65) Prior Publication Data

US 2020/0309721 A1 Oct. 1, 2020

(30) Foreign Application Priority Data

Mar. 25, 2019 (DE) .......................... 102019107566.1

(51) Int. Cl.
*H01J 37/28* (2006.01)
*G01N 23/2251* (2018.01)
(52) U.S. Cl.
CPC .......... *G01N 23/2251* (2013.01); *H01J 37/28* (2013.01); *G01N 2223/401* (2013.01); *H01J 2237/2806* (2013.01)
(58) Field of Classification Search
CPC .. H01J 37/00; H01J 37/02; H01J 37/26; H01J 37/261; H01J 37/28; H01J 37/1472; H01J 37/1474; H01J 2237/2806; H01J 2237/004; G01N 23/2251; G01N 2223/401

USPC .......................................... 250/306, 307, 311
See application file for complete search history.

(56) References Cited

U.S. PATENT DOCUMENTS

| 5,929,439 A * | 7/1999 | Todokoro | ............. G02B 21/002 |
| | | | 250/310 |
| 2011/0286685 A1* | 11/2011 | Nishihara | ............... H01J 37/28 |
| | | | 382/286 |
| 2018/0286626 A1* | 10/2018 | Santo | ....................... H01J 37/28 |

OTHER PUBLICATIONS

German Office Action, with translation thereof, for corresponding DE application No. 10 2019 107 566.1 dated Aug. 23, 2019.

* cited by examiner

*Primary Examiner* — Jason L McCormack
(74) *Attorney, Agent, or Firm* — Fish & Richardson P.C.

(57) ABSTRACT

A method of generating a result image of an object using a particle beam system includes recording multiple primary images of a region of the object using the particle beam system. Recording of each of the primary images includes scanning the primary particle beam along a scan direction across the region and detecting secondary particles generated thereby. The scan directions used for recording at least one pair of two of the primary images differ at least by a first threshold value of at least 10°. The method also includes generating, based on the multiple primary images, the result image representing the region of the object.

20 Claims, 5 Drawing Sheets

METHOD FOR GENERATING A RESULT IMAGE

CROSS-REFERENCE TO RELATED APPLICATION

The present application claims benefit under 35 USC 119 of German Application No. 10 2019 107 566.1, filed Mar. 25, 2019. The entire disclosure of this application is incorporated by reference herein.

FIELD

The present disclosure relates to a method of generating a result image of an object using a particle beam system. In particular, the present disclosure relates to generating the result image based on multiple images recorded along different scan directions using the particle beam system. The particle beam system can be an electron beam system, an ion beam system or combinations thereof, for example.

BACKGROUND

Particle beam systems such as electron beam microscopes or ion beam microscopes can be used for obtaining images of an object. For this, a primary particle beam generated by the particle beam system is scanned across the object and secondary particles generated by the interaction of the primary particle beam with the object are detected. Based on the detected secondary particles, an image of the object can be obtained.

However, the scanning of the object with the primary particle beam can cause charging of the object. The charged object influences the primary particle beam and the secondary particles. This influence can cause the obtained images to contain charging artifacts caused by the charged object. This can be severe if the object includes portions of low electric conductivity or electrically non-conductive regions.

Several different approaches to address this issue are known. For example, the charging of the object can be reduced by faster scanning, by using different primary particle beam energies and by using charge compensation. In other approaches, only secondary particles having a particular kinetic energy are detected and processed to images.

However, these known techniques can diminish the quality of the obtained images due to low signal-to-noise ratios.

SUMMARY

The present disclosure seeks to provide a method of obtaining an image of an object using a particle beam system wherein image artifacts due to charging of the object are reduced.

An embodiment of the disclosure is directed to a method of generating a result image of an object using a particle beam system. The particle beam system can be an electron beam system, an ion beam system or combinations thereof, for example. The method includes recording multiple primary images of a region of the object using the particle beam system generating a primary particle beam, wherein the recording of each of the primary images includes scanning the primary particle beam along a scan direction across the region and detecting secondary particles generated thereby, wherein the scan directions used for recording at least one pair of two of the primary images differ at least by a first threshold value of at least 10°; and generating, based on the recorded multiple primary images, the result image representing the region of the object.

According to this embodiment, multiple primary images of a region of the object are recorded by use of the particle beam system. Accordingly, each of the multiple primary images includes an image section representing the same region of the object.

Each of the primary images can be recorded by scanning the primary particle beam along a scan direction across the region and by detecting secondary particles generated thereby. Due to the interaction of the primary particle beam with the object, secondary particles are generated and emanate from the object. The secondary particles can be backscattered electrons, secondary electrons, backscattered ions, secondary ions or radiation (e.g. photons, X-rays, etc.), for example.

Scanning the primary particle beam across the region means that the primary particle beam is incident onto the region and the location of incidence of the primary particle beam on the object is moved. The scan direction can be regarded as the direction of a velocity vector of the location of incidence. Alternatively, the scan direction can be regarded as the direction of a velocity vector of a point of intersection of the primary particle beam with a focal plane generated by the particle beam system for the primary particle beam.

The scan directions used for recording at least one pair of two of the primary images differ that at least by the first threshold value which amounts to at least 10°. A pair of two of the primary images is a set of two different primary images among all of the recorded primary images. Accordingly, during the recording of the primary images, the region is scanned along scan directions differing at least by the first threshold value. Accordingly, the multiple primary images are recorded using scan directions which are significantly different from each other.

The primary images can include charging artifacts resulting from charging of the object due to the scanning of the primary particle beam across the region. However, charging artifacts of a particular primary image depend on the scan direction used for recording this image. Charging artifacts at image locations in the primary images corresponding to a single object location of the object can be different due to the different scan directions used for recording the primary images. However, based on the multiple primary images, a result image can be generated in which charging artifacts are mitigated. For example, the result image can be generated by averaging image values at corresponding image locations of the multiple primary images, i.e. by averaging image values at locations in the primary images representing a same location of the object.

According to a preferred embodiment, the scan directions used for recording a predetermined amount of pairs of two of the primary images differ at least by the first threshold value. The predetermined amount can be at least 3 or at least 6 or at least 12 or at least 18 or at least 36 or at least 100 or at least 250, for example. Accordingly, during the recording of the primary images, the region is scanned along many different scan directions differing at least by the first threshold value. This can increase the mitigation of the charging artifacts in the result image.

According to a preferred embodiment, the first threshold value is 20° or 30° or 80° or 150°. Selecting the first threshold value above 10° can further improve the mitigation of the charging artifacts in the result image.

According to another preferred embodiment, some of the scan directions used for recording at least one pair of two of the primary images are substantially opposite to each other. Scan directions can be regarded as substantially opposite to each other if the scan directions differ by at least 175° and by at most 185°. This means that the primary images of at least one pair of two of the primary images are recorded using scan directions being substantially opposite to each other.

According to another preferred embodiment, at least 3, at least 4, at least 10, at least 20 or at least 60 primary images are recorded and used for generating the result image. Each of the primary images can be recorded using a different scan direction. The higher the number of primary images used for generating the result image, the better the mitigation of the charging artifacts in the result image can be.

According to another preferred embodiment, the scan directions used for recording each individual one of the primary images differ from each other at most by a second threshold value. The second threshold value can be 2° or 1°, for example.

According to this embodiment, the scan directions used for recording one individual image may differ from each other at most by the second threshold value. The second threshold value can be as small as 1° or even below. Choosing the second threshold value that small means that this one individual image is recorded by scanning the primary particle beam across the region along substantially the same scan direction until the recording of the one individual image is finished. For example, the region can be scanned along multiple separated parallel straight lines. The directions of these straight lines are parallel to each other and therefore the scan directions used for recording this one individual image are substantially the same. This condition shall be fulfilled for each individual one of the primary images.

While the scan directions used for recording each individual one of the primary images are substantially the same (i.e., differing from each other at most by the second threshold value), the scan directions used for recording at least one pair of two of the primary images still differ at least by the first threshold value of at least 10°. That means that each individual primary image is recorded using substantially a single scan direction while the scan directions used for recording different primary images are substantially different.

According to a preferred embodiment, the scan directions used for recording all pairs of two of the primary images differ at least by a third threshold value of at least 0.1°. Accordingly, each of the primary images is recorded using a different scan direction. The scan directions of different primary images differ at least by the third threshold value. The third threshold value can be 0.2° or 0.3°.

According to another preferred embodiment, the generating of the result image includes determining average values by averaging image values of the primary images at corresponding image locations in the primary images. Each of the primary images can include multiple image locations wherein an image value is assigned to each of the image locations. Corresponding image locations are image locations in the primary images that represent a same location of the object. The expression "corresponding image locations" therefore represents image locations in different primary images, wherein each of these image locations represents the same location of the object. The image values assigned to corresponding image locations are averaged to determine the average values. The result image is generated based on the average values. By this, charging artifacts in the result image are mitigated.

The determining of the average values can be performed by determining mean values or median values or mode values of the image values, for example. Other averages such as arithmetic mean values, harmonic mean values, cubic mean values and others can be used. Further/different operations can be performed in the primary images to generate the result image.

The corresponding image locations in the primary images can be determined based on an image analysis of the primary images. For example, the primary images can be correlated to each other which allows to identify corresponding image locations in the primary images.

BRIEF DESCRIPTION OF THE DRAWINGS

Embodiments of the disclosure are subsequently described with reference to figures.

DESCRIPTION OF EXEMPLARY EMBODIMENTS

Figure 1:
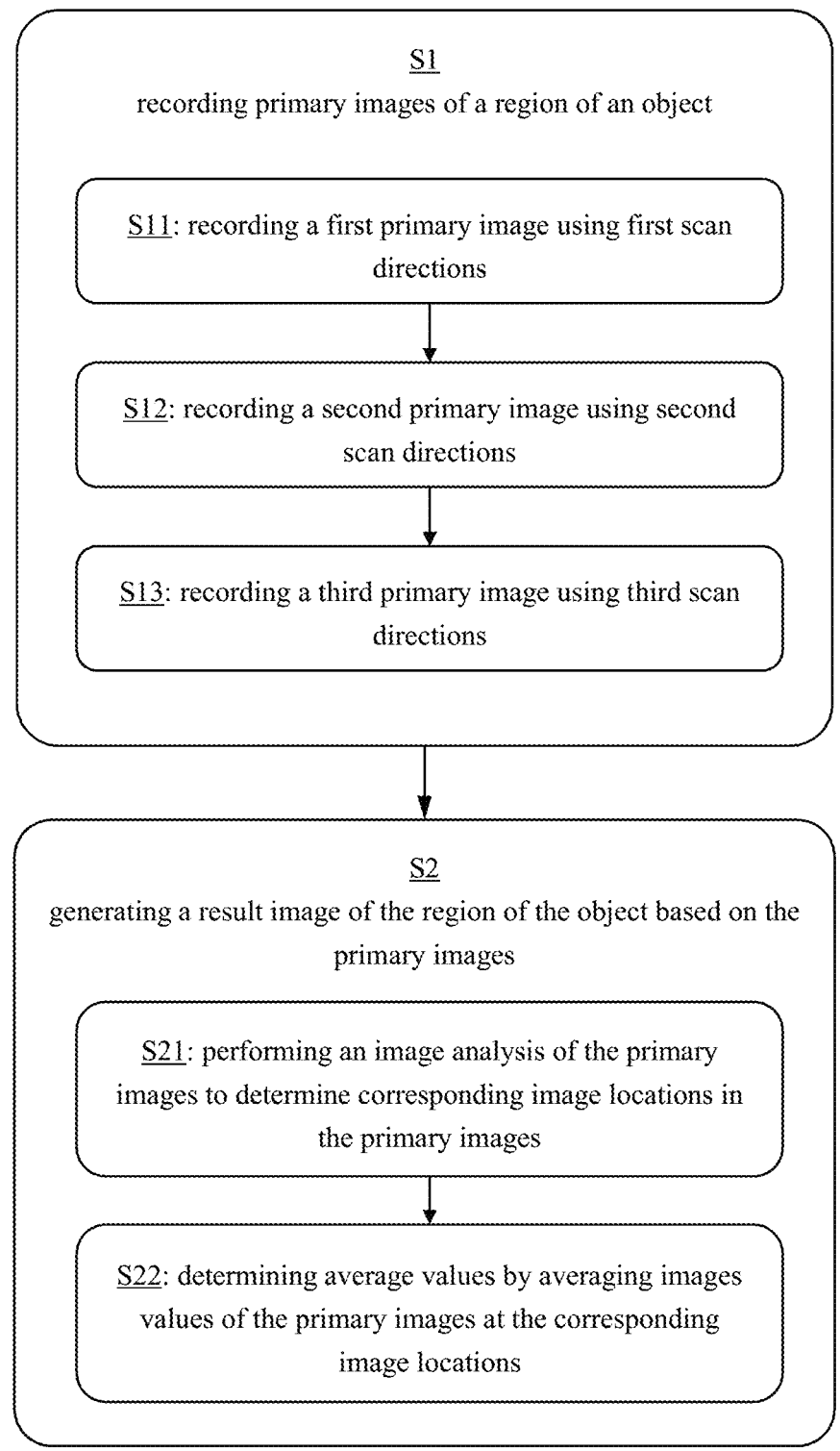
FIG. 1 shows a flowchart illustrating an embodiment of a method of generating a result image of an object using a particle beam system.

FIG. 1 shows a flow chart illustrating an embodiment of a method of generating a result image of an object using a particle beam system.

First, in step S1, multiple primary images of a region of an object are recorded using a particle beam system. In step S2, subsequent to step S1, a result image of the region of the object is generated based on the primary images recorded in step S1.

In the following description, the number of primary images recorded will amount to three. However, the method can be performed with an amount of two or more primary images.

According to the example illustrated in FIG. 1, step S1 includes steps S11, S12 and S13. In step S11 a first primary image is recorded using first scan directions. Step S11 is described in more detail with reference to FIG. 2A.

Figure 2A:
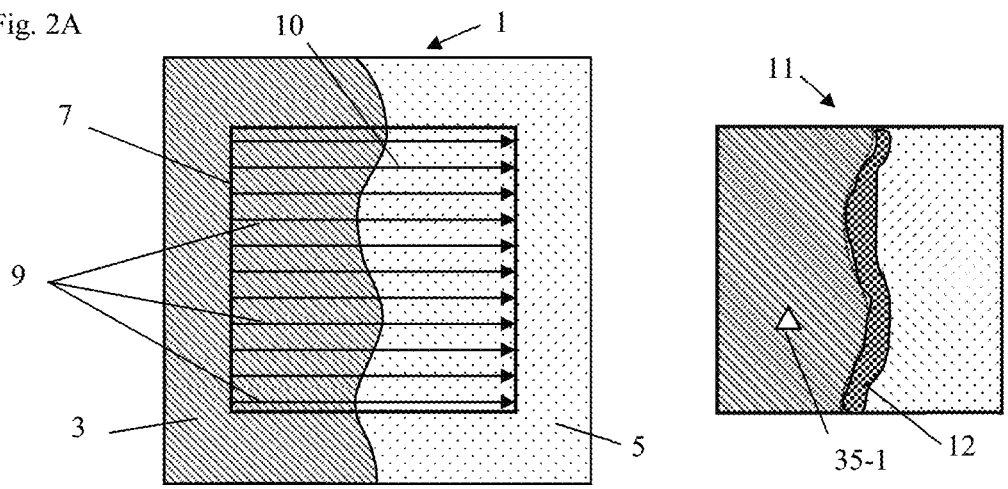
FIGS. 2A-2C show schematic illustrations of an object, primary images of the object and scan directions used for recording the primary images.

FIG. 2A shows, on its left, a schematic illustration of an object 1 by an elevational view onto a surface of the object 1 and, on its right, a schematic illustration of the first primary image 11. The object 1 includes a first portion 3 of a first material and a second portion 5 of a second material. The materials of the portions 3 and 5 are different and therefore are illustrated by different textures. The different materials of the portions 3 and 5 can cause charging artifacts during scanning if at least one of the materials is electrically non-conductive.

A bold-lined square represents a first region 7 of the object 1 scanned for recording the first primary image 11. The first primary image 11 is recorded by scanning the particle beam across the first region 7 along first scan paths 9 and by detecting secondary particles emerging from the object 1 due to the scanning. The first scan paths 9 are illustrated by arrows covering the first region 7. In this case, the first region 7 is scanned along straight separated parallel lines. Accordingly, the first primary image 11 is recorded by scanning the primary particle beam across the first region 7 along a single first scan direction 10 indicated by the arrows.

Due to the different materials of the regions 3 and 5 of the object 1, the first primary image 11 includes charging artifacts 12 in proximity of the material intersection. Note that a triangle 35-1 illustrated in the first primary image 11 is not contained in the first primary image 11. The triangle 35-1 represents an image location within the first primary image 11 described below.

Other scan patterns for recording the first primary image 11 can be used. In such cases, the first primary image 11 is recorded by scanning the primary particle beam along multiple different first scan directions across the first region 7. An example of such a case will be described with reference to FIG. 5.

Referring back to FIG. 1, step S1 further includes step S12, subsequent to step S11, of recording a second primary image using second scan directions. Step S12 is described in more detail with reference to FIG. 2B.

Figure 2B:
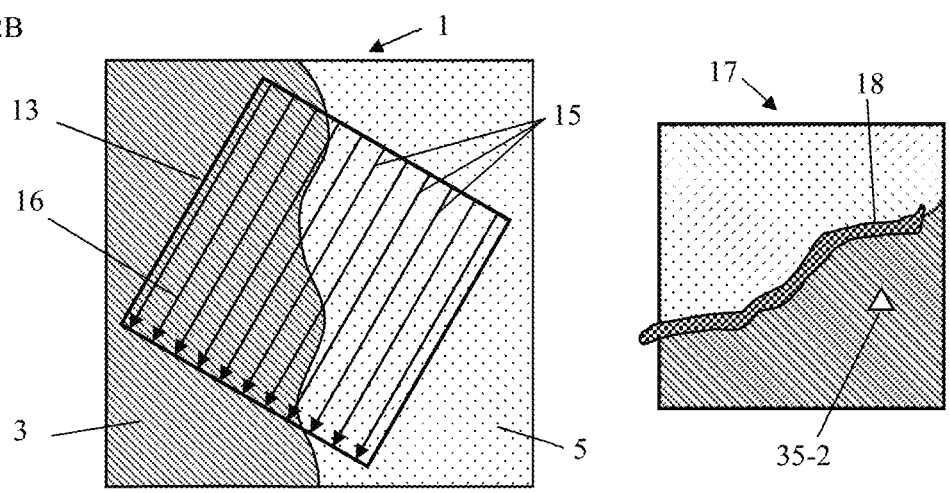

FIG. 2B shows, on its left, a schematic illustration of the object 1 similar to FIG. 2A and, on its right, a schematic illustration of the second primary image 17. A bold-lined square represents a second region 13 of the object 1 scanned for recording the second primary image 17. The second primary image 17 is recorded by scanning the particle beam across the second region 13 along second scan paths 15 and by detecting secondary particles emerging from the object 1 due to the scanning. The second scan paths 15 are illustrated by arrows covering the second region 13. In this case, the second region 13 is scanned along straight separated parallel lines. Accordingly, the second primary image 17 is recorded by scanning the primary particle beam across the second region 13 along a single second scan direction 16 indicated by the arrows. The second scan direction 16 differs from the first scan direction 10 by 120° in clockwise direction.

Due to the different materials of the regions 3 and 5 of the object 1, the second primary image 17 includes charging artifacts 18 in proximity of the material intersection. Note that a triangle 35-2 illustrated in the second primary image 17 is not contained in the second primary image 17. The triangle 35-2 represents an image location within the second primary image 17 described below.

Referring back to FIG. 1, step S1 further includes step S13, subsequent to step S12, of recording a third primary image using third scan directions. Step S13 is described in more detail with reference to FIG. 2C.

Figure 2C:
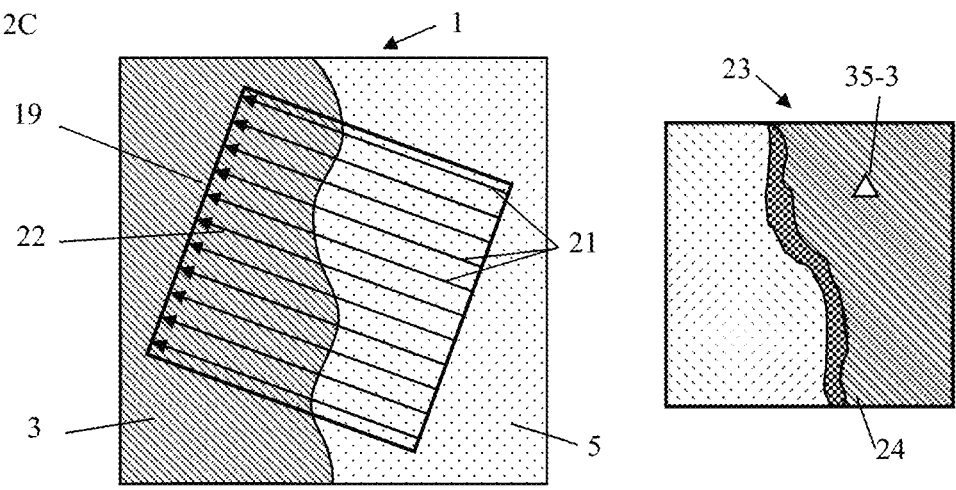

FIG. 2C shows, on its left, a schematic illustration of the object 1 similar to FIGS. 2A and 2B and, on its right, a schematic illustration of the third primary image 23. A bold-lined square represents a third region 19 of the object 1 scanned for recording the third primary image 23. The third primary image 23 is recorded by scanning the particle beam across the third region 19 along third scan paths 21 and by detecting secondary particles emerging from the object 1 due to the scanning. The third scan paths 21 are illustrated by arrows covering the third region 21. In this case, the third region 19 is scanned along straight separated parallel lines. Accordingly, the third primary image 23 is recorded by scanning the primary particle beam across the third region 19 along a single third scan direction 22 indicated by the arrows. The third scan direction 22 differs from the first scan direction 10 by 200° in clockwise direction.

Due to the different materials of the regions 3 and 5 of the object 1, the third primary image 23 includes charging artifacts 24 in proximity of the material intersection. Note that a triangle 35-3 illustrated in the third primary image 23 is not contained in the third primary image 23. The triangle 35-3 represents an image location within the third primary image 23 described below.

Figure 3:
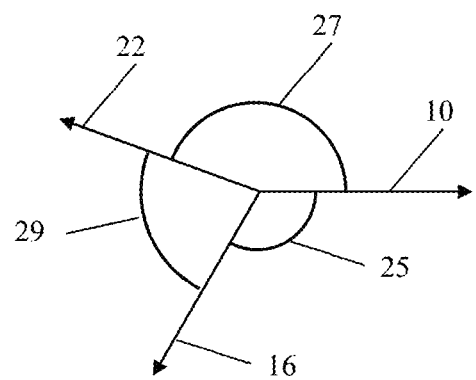
FIG. 3 shows a schematic illustration of the scan directions used for recording the primary images of FIGS. 2A, 2B and 2C.

FIG. 3 shows a schematic illustration of the scan directions 10, 16, 22 used for recording the primary images 11, 17 and 23. In particular, FIG. 3 shows the first scan direction 10 used for recording the first primary image 11, the second scan direction 16 used for recording the second primary image 17, and the third scan direction 22 used for recording the third primary image 23. The first scan direction 10 and the second scan direction 16 differ by an angle 25. The first scan direction 10 and the third scan direction 22 differ by an angle 27. The second scan direction 16 and the third scan direction 22 differ by an angle 29.

Herein, the angle between two directions can be defined as the smaller one of the two angles formed between the two directions. In the example described with reference to FIG. 3, the angle 25 is 120°, the angle 27 is 160°, and the angle 29 is 80°.

According to the method described with reference to FIG. 1, the scan directions used for recording at least one pair of two of the primary images differ at least by a first threshold value of at least 10°. In the present example, the following pairs of two of the primary images 11, 17 and 23 are possible: the first primary image 11 and the second primary image 17 as a first pair of two; the first primary image 11 and the third primary image 23 as a second pair of two; and the second primary image 17 and the third primary image 23 as a third pair of two. According to the feature defined above, the scan directions used for recording the primary images of at least one of these pairs shall differ at least by the first threshold value. In the present example, this condition is fulfilled for all pairs of two of the primary images 11, 17, 23 because each of the angles 25, 27 and 29 is greater than 10°.

The first threshold value is at least 10° but may amount to 150°, for example. Assuming a first threshold value of 150°, the above-mentioned condition is only fulfilled by the second pair of two, i.e. by the scan directions used for recording the first primary image 11 and the third primary image 23 because, among the angles 25, 27 and 29, only angle 27 is greater than the first threshold value of 150°. However, as long as the scan directions used for recording at least one pair of two of the primary images 11, 17, 23 differ at least by the first threshold value, the above-mentioned condition is fulfilled. Referring back to FIG. 1, step S2 of generating a result image of the region of the object 1 based on the primary images 11, 17, 23 is performed subsequent to step S1. Step S2 includes steps S21 and S22.

Figure 4:
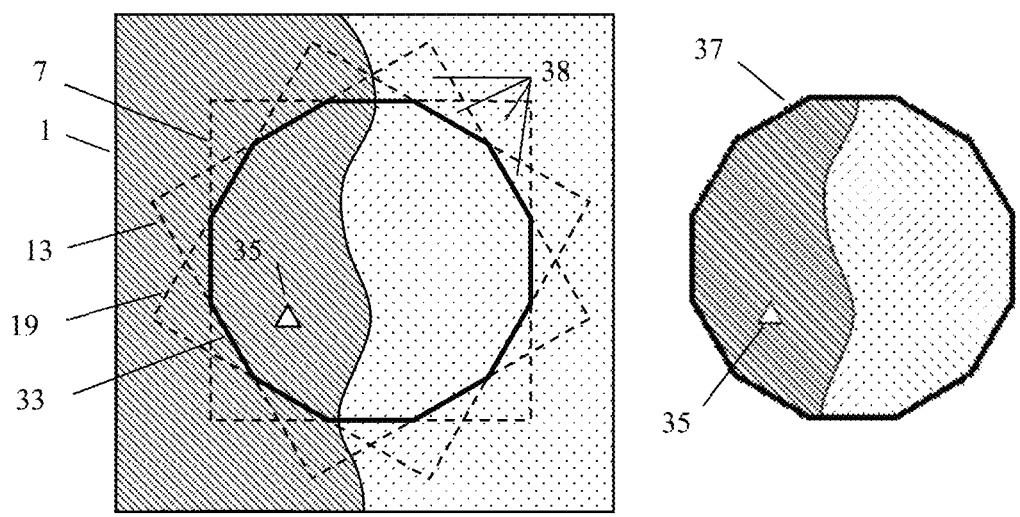
FIG. 4 shows a schematic illustration of a result image generated from the primary images of FIGS. 2A, 2B and 2C.

In step S21, an image analysis of the primary images 11, 17, 23 is performed in order to determine corresponding image locations in the primary images 11, 17, 23. FIG. 4 shows, on its left, a schematic illustration of the object 1 and, on its right, a schematic illustration of the result image 37. The first region 7, the second region 13 and the third region 19 overlap each other. The intersection of the first region 7, the second region 13 and the third region 19 is illustrated by a polygon which represents a region 33 of the object 1 common to all of the primary images 11, 17, 23. In other words, the region 33 of the object 1 is represented in each of the primary images 11, 17, 23.

An exemplary object location 35 within the region 33 of the object 1 is illustrated by a triangle. The object location 35 is represented in each of the primary images 11, 17, 23. However, in each of the primary images 11, 17, 23, the object location 35 is generally represented at a different image location, i.e. a location with respect to the image, because each of the primary images 11, 17, 23 represents a different region of the object 1. Referring to FIG. 2A, an image location 35-1 represents the object location 35. Referring to FIG. 2B, an image location 35-2 represents the object location 35. Referring to FIG. 2C, an image location 35-3 represents the object location 35. The image locations 35-1, 35-2, 35-3 in the primary images 11, 17, 23 represent the same object location 35 and therefore are referred to as corresponding image locations in the primary images 11.

The image analysis can be used to determine the corresponding image locations 35-1, 35-2, 35-3 in the primary images 11, 17, 23 for the object location 35 and other object locations of the object 1.

Performing an image analysis on the primary images 11, 17, 23 is one way of determining the corresponding image locations. The image analysis can be performed using correlation of the primary images 11, 17, 23, for example. Other approaches for determining the corresponding image locations in the primary images 11, 17, 23 can be used.

Referring back to FIG. 1, in step S22 subsequent to step S21, average values are determined by averaging image values at the corresponding image locations 35-1, 35-2, 35-3 of the primary images 11, 17, 23. The average values can be determined for multiple different object locations 35 of the region 33 of the object 1 for which corresponding image locations were determined. The determining of the average values may include determining mean values or median values or mode values of the image values at corresponding image locations in the primary images, for example.

Based on the average values determined in step S22, the result image 37 of the region 33 of the object 1 is generated. The result image 37 as illustrated in FIG. 4 does not contain charging artifacts. At least, the charging artifacts are mitigated in the result image.

In the preceding description, the first region 7 is scanned for recording the first primary image 11, the second region 13 is scanned for recording the second primary image 17, and the third region 19 is scanned for recording the third primary image 23. The region 33 is the intersection of the first, second and third regions 7, 13, 19. For generating the result image 37, the image values at image locations of the primary images 11, 17, 23 representing the region 33 are used. In contrast the image values at image locations of the primary images 11, 17, 23 representing locations of the object 1 outside the region 33 are not used for generating the result image 37. Accordingly, during the recording of the first, second and third primary images 11, 17, 23, some regions 38 of the object 1 are scanned, but the image values obtained for these regions 38 are not used for generating the result image 37.

In order to avoid this unnecessary scanning, the recording of the primary images can be performed so that substantially nothing else but the region 33 to be represented by the result image 37 is scanned. For example, the recording of the primary images can be performed so that a ratio of an area of the regions 38 of the object 1, the image values of which are not used for generating the result image 37, to an area of the region 33, the image values of which are used for generating the result image 37, amounts to at most 50%, in particular at most 10% or at most 1%.

Referring to FIG. 4, the shape of the result image 37 is a regular polygon having 12 vertices. Recording the primary images so that only the region 33 represented by the result image 37 is scanned avoids scanning regions 38 of the object 1. Accordingly, the recording can be performed in less time and charging of the object 1 is reduced.

The shape of the result image can be circular, for example. In this case, the shape of the primary images can be circular to avoid unnecessary scanning.

For simplification of the description of the recording of the primary images with reference to FIGS. 2A to 2C, it was assumed that a single scan direction was used for the recording of each individual one of the primary images 11, 17, 23. However, in practice, the scan directions used for recording each individual one of the primary images can differ to a certain extent. Accordingly, multiple different scan directions are used for recording each individual one of the primary images. This is described with reference to FIG. 5.

Figure 5:
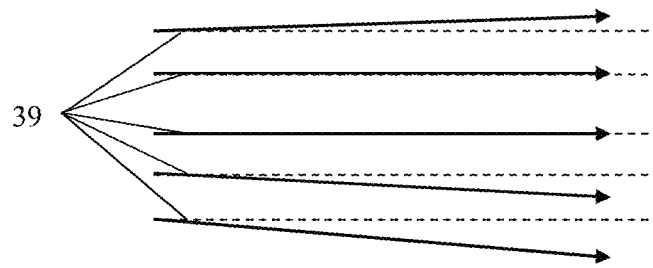
FIG. 5 shows a schematic illustration of scan directions used for recording one individual image.

FIG. 5 shows a schematic illustration of scan directions 39 used for recording a single primary image. Parallel dashed lines are illustrated for simplifying the comparison between the scan directions 39. Some of the scan directions 39 differ from each other. The scan directions 39 shall differ from each other at most by a second threshold value of 2° or 1°, for example. While the scan directions 10, 16, 22 used for recording at least one pair of two of the primary images 11, 17, 23 shall differ considerably from each other, the scan directions 39 used for recording each individual one of the primary images shall differ from each other only slightly, i.e., at most by the second threshold value.

Another preferred condition regarding the scan directions is described with reference to FIG. 3. The scan directions 10, 16, 22 used for recording all pairs of two of the primary images 11, 17, 23 shall differ at least by a third threshold value of at least 0.1°. The third threshold value can amount to 0.2° or 0.3°, for example. The scan directions used for recording all pairs of two of the primary images 11, 17, 23 differ by at least 80° in the example illustrated in FIG. 3 because the smallest one of the angles 25, 27, 29 is 80°. Accordingly, each of the primary images is recorded using a scan direction differing from all other scan directions of other primary images at least by the third threshold value.

The methods described herein can be performed by particle beam systems described with reference to FIGS. 6 and 7.

Figure 6:
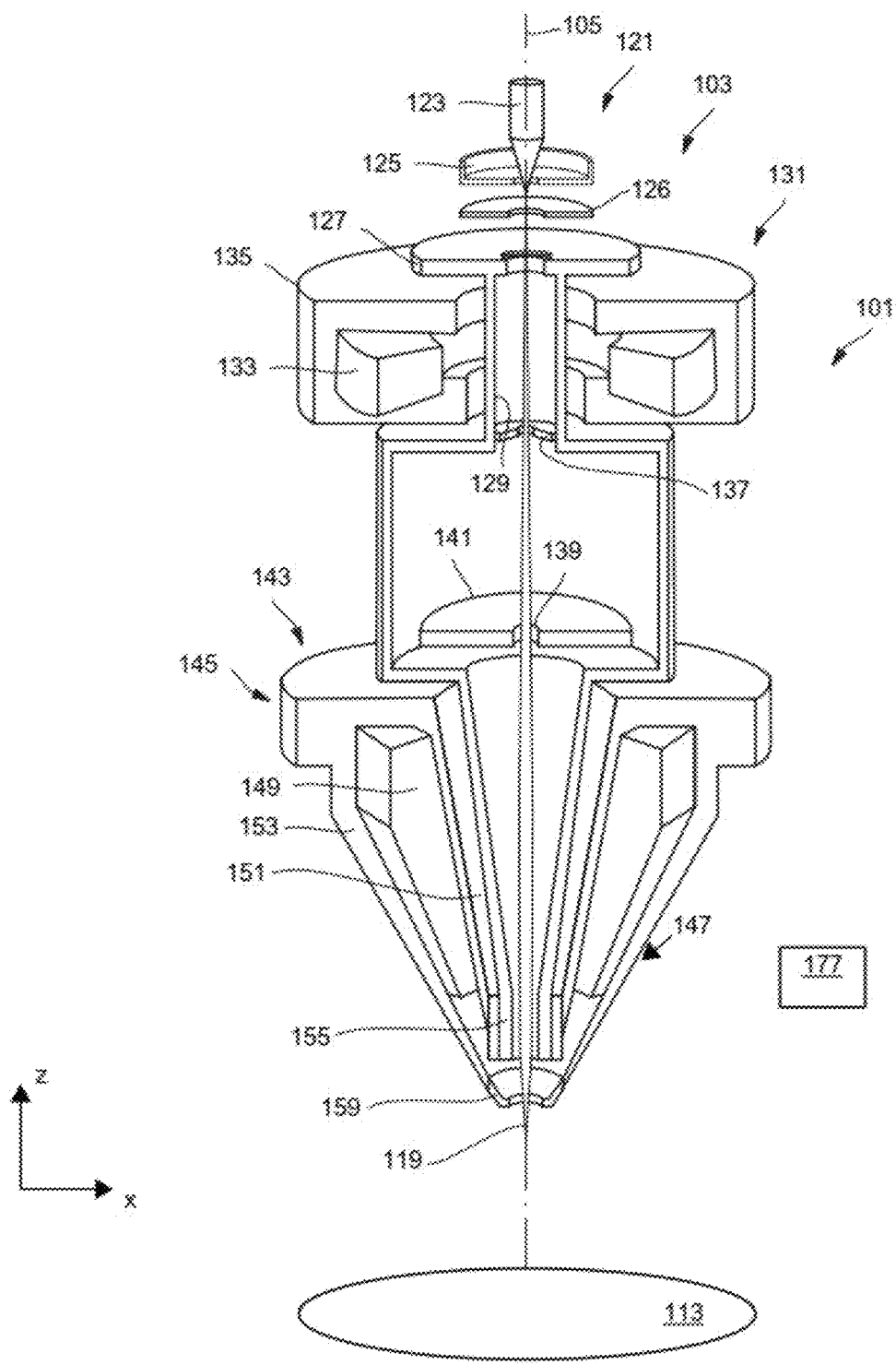
FIG. 6 shows a schematic illustration of a particle beam system.

In a perspective and schematically simplified illustration, FIG. 6 shows a particle beam system 101 including an electron microscopy system 103 having a main axis 105.

The electron microscopy system 103 is configured to generate a primary electron beam 119 which is emitted along the main axis 105 of the electron microscopy system 103 and to direct the primary electron beam 119 onto an object 113.

The electron microscopy system 103 includes, for producing the primary electron beam 119, an electron source 121, which is illustrated schematically by way of a cathode 123 and a suppressor electrode 125, and an extractor electrode 126, which is arranged at a distance therefrom. The electron microscopy system 103 furthermore includes an acceleration electrode 127 which transitions into a beam tube 129 and runs through a condenser arrangement 131, which is illustrated schematically by way of a toroidal coil 133 and a yoke 135. After the primary electron beam 119 has passed through the condenser arrangement 131, it runs through a pinhole aperture 137 and a central hole 139 in a secondary particle detector 141, whereupon the primary electron beam 119 enters an objective lens 143 of the electron microscopy system 103. The objective lens 143 includes a magnetic lens 145 and an electrostatic lens 147 for focusing the primary electron beam 119. In the schematic illustration of FIG. 6, the magnetic lens 145 includes a toroidal coil 149, an internal pole piece 151 and an external pole piece 153. The electrostatic lens 147 is formed by a lower end 155 of the beam tube 129, the internal lower end of the external pole piece 153, and a toroidal electrode 159 which tapers conically towards the object 113.

Although not illustrated in FIG. 6, the electron microscopy system 103 further includes a deflection system for deflecting the primary particle beam 119 in directions perpendicular to the main axis 105. Therefore, the primary electron beam 119 can be scanned across the object 113.

The particle beam system 101 furthermore includes a controller 177, which controls the operation of the particle beam system 101. The controller 177 in particular controls the operation of the electron microscopy system 103 according to step S1 and performs step S2.

The secondary particle detector 141 is configured to detect secondary particles, e.g., electrons, ions, radiation or combinations thereof. In the above example, the secondary particle detector 141 is located within the beam tube 129. However, according to further embodiments, the secondary particle detector 141 can be located outside the beam tube 129, for example inside a vacuum chamber containing the particle beam system 101.

Figure 7:
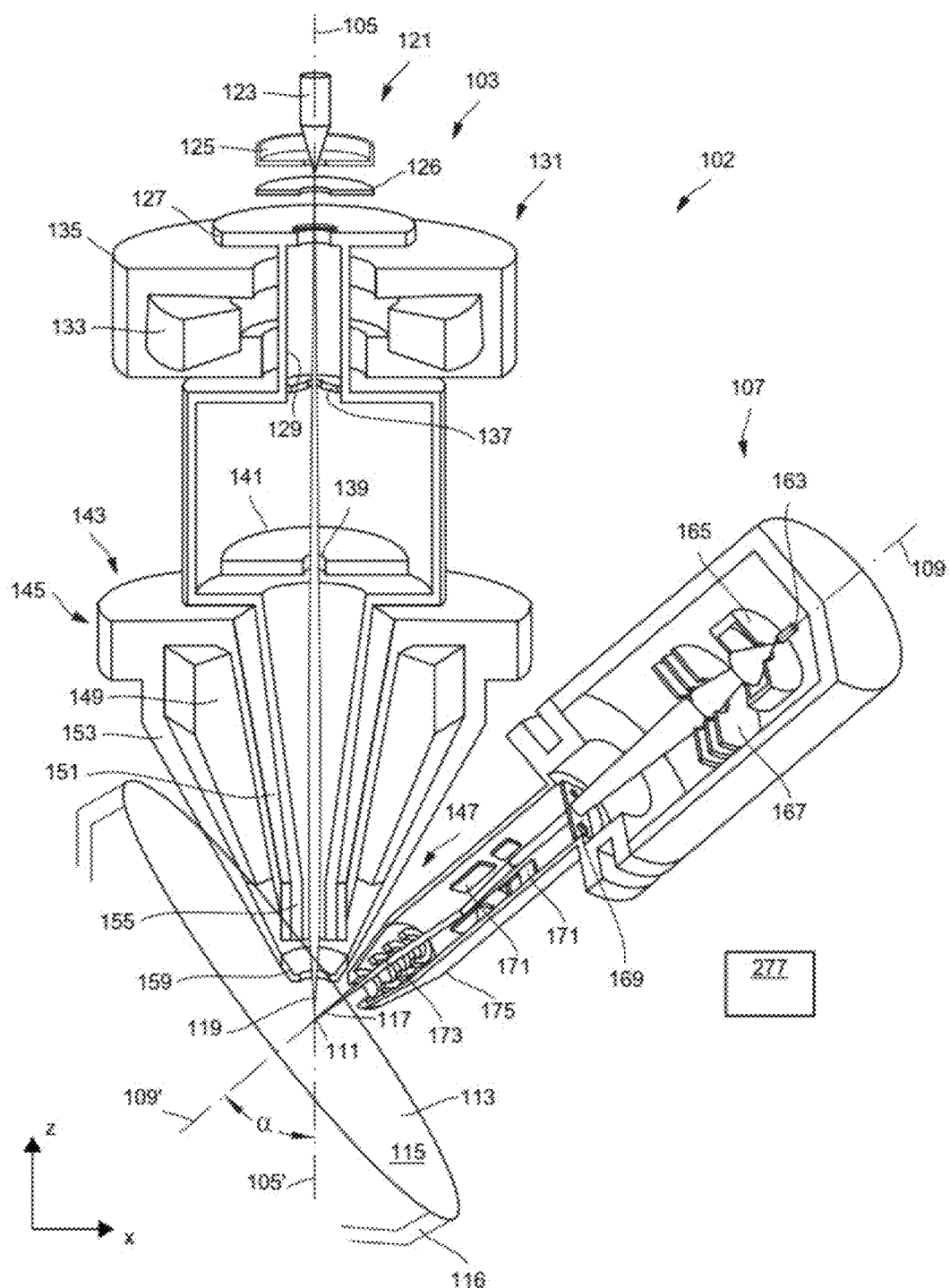
FIG. 7 shows a schematic illustration of another particle beam system.

In a perspective and schematically simplified illustration, FIG. 7 shows a particle beam system 102 including an ion beam system 107 having a main axis 109 and the electron microscopy system 103 described above with reference to FIG. 6.

The main axes 105 and 109 of the electron microscopy system 103 and the ion beam system 107 intersect at a site 111 within a shared working region at an angle α, which can have a value of, for example, 45° to 55° or about 90°, resulting in that an object 113 to be analyzed and/or processed having a surface 115 can both be processed in a region of the site 111 using a primary ion beam 117 which is emitted along the main axis 109 of the ion beam system 107 and be analyzed using the primary electron beam 119 which is emitted along the main axis 105 of the electron microscopy system 103. For holding the object 113, a schematically indicated holder 116 is provided, which can adjust the object 113 with respect to its distance from and orientation with respect to the electron microscopy system 103 and the ion beam system 107.

The ion beam system 107 includes an ion source 163 having an extraction electrode 165, a condenser 167, a stop 169, deflection electrodes 171 and a focusing lens 173 for producing the ion beam 117 which exits a housing 175 of the ion beam system 107. The longitudinal axis 109' of the holder 116 is inclined with respect to the vertical 105' by an angle which in this example corresponds to the angle α between the main axes 105 and 109. However, the directions 105' and 109' do not need to coincide with the main axes 105 and 109, and the angle they enclose does not have to match the angle α between main axes 105 and 109.

The particle beam system 102 furthermore includes the controller 277, which controls operation of the particle beam system 102. The controller 277 in particular controls operation of the electron microscopy system 103, the ion beam system 107 and the holder 116 according to step S1 and performs step S2.

What is claimed is:

1. A method, comprising:
   i) recording multiple primary images of a region of an object using a particle beam system that generates a primary particle beam, each primary image being recorded by a method comprising:
   scanning the primary particle beam along a scan direction across the region of the object; and
   detecting secondary particles generated thereby; and
   ii) generating, based on the recorded multiple primary images, a result image of the object which represents the region of the object,
   wherein:
   for a pair of primary images, the scan directions differ by at least 10°;
   generating the result image comprises determining average values by averaging image values at corresponding image locations in the primary images; and
   determining the average values comprises a member selected from the group consisting of:
   determining mean values of the image values at the corresponding image locations in the primary images;
   determining median values of the image values at the corresponding image locations in the primary images; and
   determining mode values of the image values at the corresponding image locations in the primary images.

2. The method of claim 1, wherein, for each of two pairs of primary images, the scan directions differ by at least 10°.

3. The method of claim 1, wherein, for each of at least three pairs of primary images, the scan directions differ by at least 10°.

4. The method of claim 1, wherein, for the pair of primary images, the scan directions differ by at least 20°.

5. The method of claim 1, wherein, for the pair of primary images, the scan directions differ by at least 30°.

6. The method of claim 1, wherein, for at least one pair of primary images, the scan directions are substantially opposite to each other.

7. The method of claim 1, wherein at least three primary images are recorded using different scan directions.

8. The method of claim 1, wherein the scan directions used for recording each individual one of the primary images differ from each other by at most 2°.

9. The method of claim 1, wherein the scan directions used for recording each individual one of the primary images differ from each other by at most 1°.

10. The method of claim 1, wherein, for each pair of primary images, the scan directions differ by at least 0.1°.

11. The method of claim 1, wherein, for each pair of primary images, the scan directions differ by at least 0.2°.

12. The method of claim 1, further comprising determining the corresponding image locations in the primary images based on an image analysis of the primary images.

13. The method of claim 12, wherein the image analysis of the primary images comprises a correlation of the primary images to each other.

14. The method of claim 1, wherein determining the average values comprises determining mean values of the image values at the corresponding image locations in the primary images.

15. The method of claim 14, wherein, for each of two pairs of primary images, the scan directions differ by at least 10°.

16. The method of claim 1, wherein determining the average values comprises determining median values of the image values at the corresponding image locations in the primary images.

17. The method of claim 16, wherein, for each of two pairs of primary images, the scan directions differ by at least 10°.

18. The method of claim 1, wherein determining the average values comprises determining mode values of the image values at the corresponding image locations in the primary images.

19. The method of claim 18, wherein, for each of two pairs of primary images, the scan directions differ by at least 10°.

20. The method of claim 12, wherein, for each of two pairs of primary images, the scan directions differ by at least 10°.

* * * * *